(12) United States Patent
Kouda et al.

(10) Patent No.: US 7,446,264 B2
(45) Date of Patent: Nov. 4, 2008

(54) ELECTROMAGNETIC WAVE SHIELDING GASKET

(75) Inventors: Yutaka Kouda, Kanagawa (JP); Keiichi Miyajima, Kanagawa (JP); Takeshi Yamada, Kanagawa (JP); Tomohiro Inoue, Kanagawa (JP)

(73) Assignee: NOK Corporation, Tokyo (JP)

( * ) Notice: Subject to any disclaimer, the term of this patent is extended or adjusted under 35 U.S.C. 154(b) by 0 days.

(21) Appl. No.: 11/793,280

(22) PCT Filed: Nov. 24, 2005

(86) PCT No.: PCT/JP2005/021527

§ 371 (c)(1),
(2), (4) Date: Jun. 15, 2007

(87) PCT Pub. No.: WO2006/064642

PCT Pub. Date: Jun. 22, 2006

(65) Prior Publication Data

US 2008/0130260 A1    Jun. 5, 2008

(30) Foreign Application Priority Data

Dec. 15, 2004  (JP)  ............................. 2004-362371
May 16, 2005   (JP)  ............................. 2005-142138

(51) Int. Cl.
H05K 9/00  (2006.01)

(52) U.S. Cl. ................... 174/356; 174/366; 174/369; 277/920

(58) Field of Classification Search ............... 174/356, 174/366, 369; 361/816, 818, 800; 277/920
See application file for complete search history.

(56) References Cited

U.S. PATENT DOCUMENTS

| 4,471,015 | A  | * | 9/1984 | Ebneth et al. ............ 428/195.1 |
| 4,720,606 | A  |   | 1/1988 | Senn |
| 4,900,877 | A  | * | 2/1990 | Dubrow et al. ............... 174/351 |
| 5,107,071 | A  |   | 4/1992 | Nakagawa |
| 5,202,536 | A  | * | 4/1993 | Buonanno .................... 174/356 |
| 6,359,213 | B1 | * | 3/2002 | Long .......................... 174/388 |
| 6,901,660 | B2 | * | 6/2005 | Miska ........................... 29/846 |
| 6,943,288 | B1 | * | 9/2005 | Miska .......................... 174/388 |
| 2003/0036326 | A1 | | 2/2003 | Takagi et al. |

FOREIGN PATENT DOCUMENTS

| JP | 58-18954 | 12/1983 |
| JP | 61-183597 | 11/1986 |
| JP | 63-79400 | 4/1988 |
| JP | 63-80897 | 5/1988 |
| JP | 63-197400 | 12/1988 |
| JP | 1-163394 | 11/1989 |

(Continued)

Primary Examiner—Hung V Ngo
(74) Attorney, Agent, or Firm—Butzel Long

(57) ABSTRACT

An electromagnetic wave shielding gasket comprising a gasket body integrated with an electroconductive non-woven fabric or woven fabric, a seal part being provided, while avoiding the area of the electroconductive non-woven fabric or woven fabric, where the gasket body, preferably a gasket body with a lip-shaped projection, is integrated at the edge with the electroconductive non-woven fabric or woven fabric, and particularly preferably an annular gasket body with a lip-shaped projection is integrated at the inner peripheral edge with the outer peripheral edge of the annular body of the electroconductive non-woven fabric or woven fabric.

10 Claims, 4 Drawing Sheets

FOREIGN PATENT DOCUMENTS

| | | |
|---|---|---|
| JP | 10-256770 | 9/1998 |
| JP | 11-068376 | 3/1999 |
| JP | 11-121965 | 4/1999 |
| JP | 11-145670 | 5/1999 |
| JP | 11-274793 | 10/1999 |
| JP | 2000-013079 | 1/2000 |
| JP | 2000-077885 | 3/2000 |
| JP | 2000-133980 | 5/2000 |
| JP | 2000-299586 | 10/2000 |
| JP | 2001-124206 | 5/2001 |
| JP | 2001-177286 | 6/2001 |
| JP | 2003-142867 | 5/2003 |
| JP | 2003-232444 | 8/2003 |
| JP | 2004-288296 | 10/2004 |

* cited by examiner

[Fig.1]
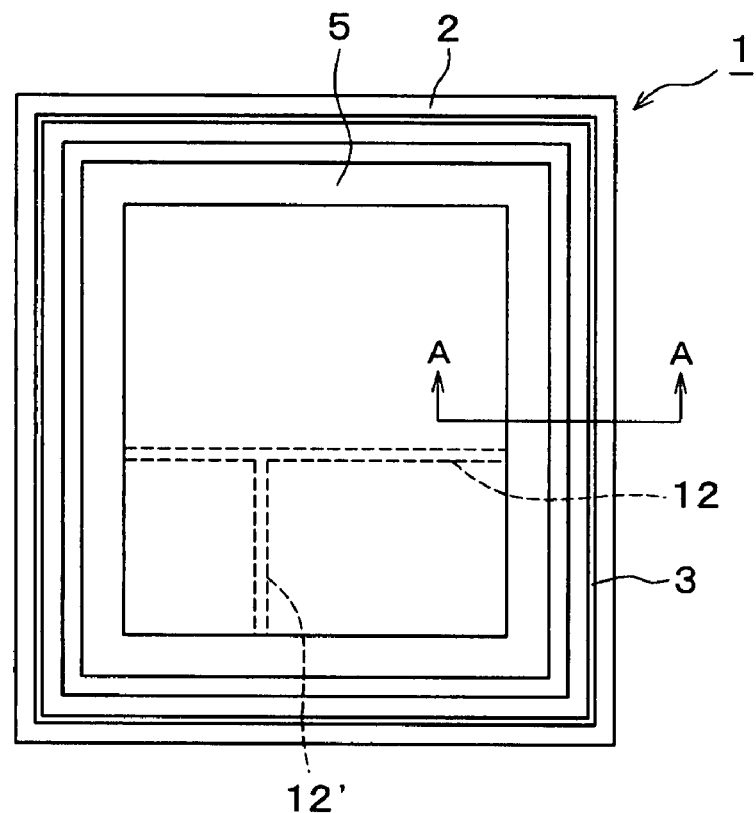
[Fig.2]
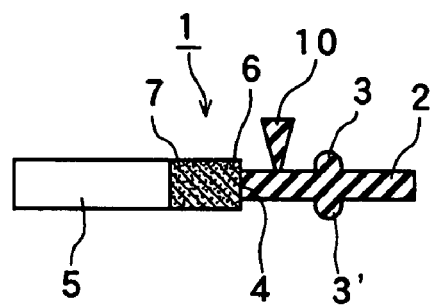

[Fig.3]
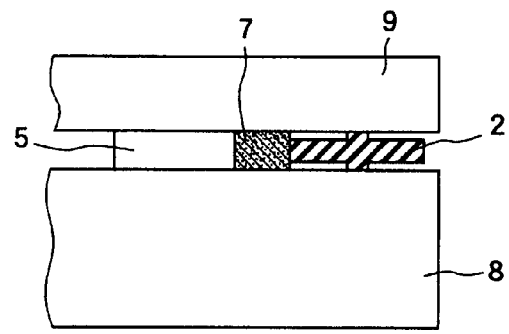
[Fig.4]
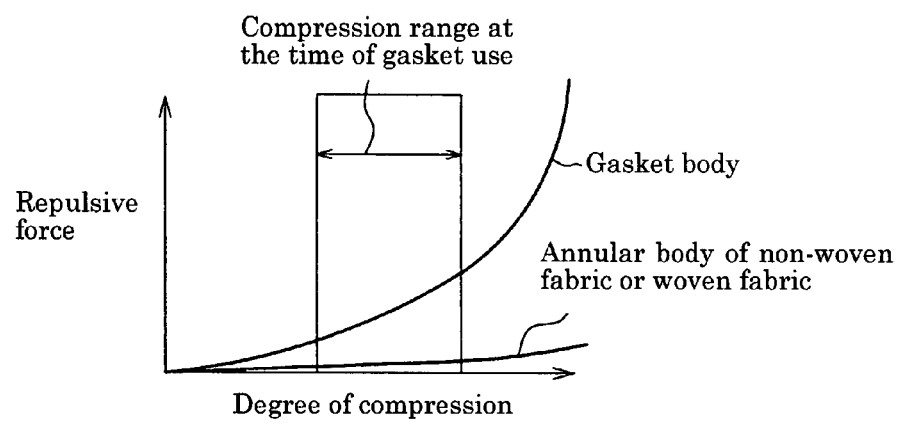
[Fig.5]
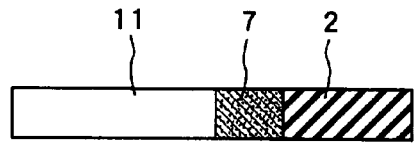
[Fig.6]
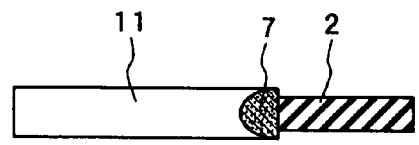

[Fig.7]
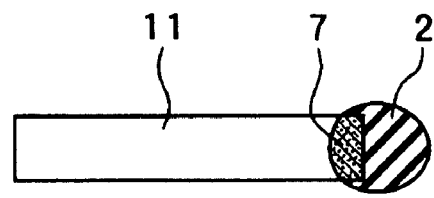
[Fig.8]
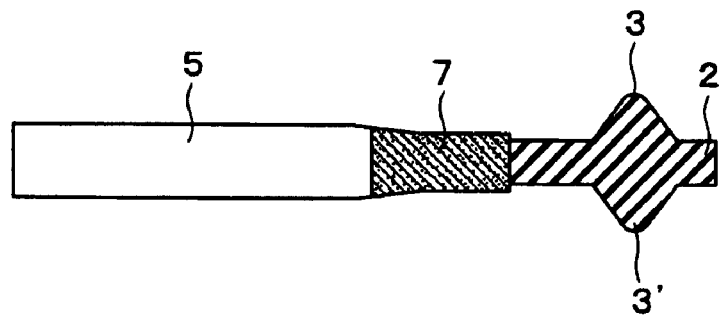

[Fig.9]
(a)
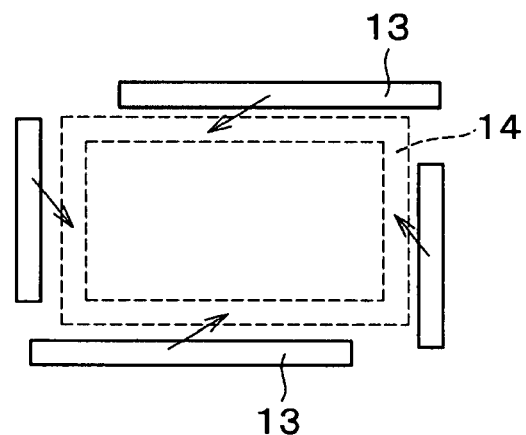
(b)
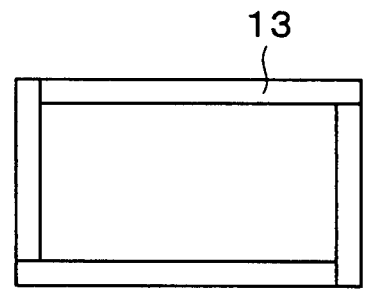
(c)
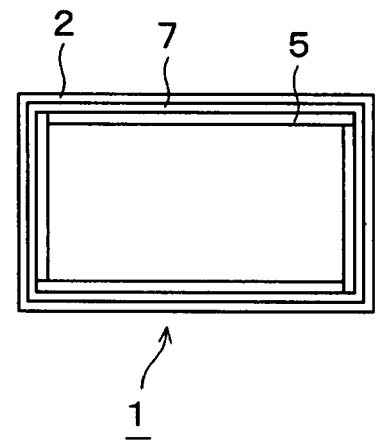

ELECTROMAGNETIC WAVE SHIELDING GASKET

RELATED APPLICATIONS

The present application is a 35 U.S.C. §371 national stage filing of International Patent Application No. PCT/JP2005/021527, filed Nov. 24, 2005, to which priority is claimed under 35 U.S.C. §120 and through which priority is claimed under 35 U.S.C. §119 to Japanese Priority Patent Application Nos. 2004-362371, filed Dec. 15, 2004 and 2005-142138, flied May 16, 2005.

TECHNICAL FIELD

The present invention relates to an electromagnetic wave shielding gasket, and more particularly to an electromagnetic wave shielding gasket prevented against durability lowering.

BACKGROUND ART

In electronic equipment containing electronic circuits, electronic devices, etc., intrusion of water or dusts from the outside through clearances between the box member and the lid member of the equipment is a problem of giving adverse effects on other component parts of the electronic equipment. Intrusion of water or dusts from the outside can be usually protected by inserting a gasket between the box member and the lid member. However, the insertion of a gasket leads to formation of clearances in the insulator inserted between the box member and the lid member, resulting in a new problem of generating electromagnetic wave leakage through the clearances.

To solve such a problem, gaskets made from electroconductive rubber are often used, but the electroconductive rubber contains electro-conductive materials as a filler, dispersed throughout the rubber, so that the elasticity of the rubber is often deteriorated to lower the gasket durability. It has been also so far proposed to improve the elasticity by complexing. The proposed complexing is based on arrangement of shielding materials on the seal sides of the gasket. Thus, the gasket still has a problem of sealing performance.

Patent Literature 1: JP-A-11-68376
Patent Literature 2: JP-A-11-274793
Patent Literature 3: JP-A-2000-133980

DISCLOSURE OF THE INVENTION

Problem to be Solved by the Invention

An object of the present invention is to provide an electromagnetic wave shielding gasket integrated with an electromagnetic wave-reflecting electroconductor, which comprises a gasket part capable of preventing intrusion of water or dusts from the outside as in the case of ordinary rubber, and an electroconductor part capable of reflecting the electromagnetic wave, both of which can effectively prevent against durability lowering and attain high reliability of working for a long period.

Means for Solving the Problem

The object of the present invention can be attained by an electromagnetic wave shielding gasket, which comprises a gasket body and an electroconductive non-woven fabric or woven fabric, the gasket body and the electroconductive non-woven fabric or woven fabric being integrated together, and a seal part being formed while avoiding the area of the electroconductive non-woven fabric or woven fabric. In such an electromagnetic wave shielding gasket, a gasket body, preferably a gasket body having a lip-shaped projection, is integrated at the edge with an electroconductive non-woven fabric or woven fabric, more preferably an annular gasket body having a lip-shaped projection is integrated at the inner peripheral edge with the outer peripheral edge of the annular body of an electroconductive non-woven fabric or woven fabric. Integration can be carried out by impregnating the electroconductive non-woven fabric or woven fabric with a gasket-forming material, whereby the gasket body can be formed at the same time, where the seal part of the gasket is formed, while avoiding the area of the non-woven fabric or woven fabric excluding the impregnated part. The seal part refers to such a part capable of applying a sufficient surface pressure to a box member by the restoring force when the gasket body is compressed, thereby attaining a sealing function.

Effect of the Invention

The present electromagnetic wave shielding gasket is in such a structure that a gasket body, preferably a gasket body having a lip-shaped projection, is integrated at the edge with an electroconductive non-woven fabric or woven fabric, and more preferably an annular gasket body is integrated at the inner peripheral edge with the outer peripheral edge of an electroconductive non-woven fabric or woven fabric, where the electro-magnetic wave can be effectively reflected from the electroconductive non-woven fabric or woven fabric, and thus it is not necessary to fill a large amount of a filler as an electroconductive material into the gasket body, thereby preventing the lowering of gasket durability and ensuring long-term working of gasket as a seal for fluids.

In the integration of the gasket body with the electroconductive non-woven fabric or woven fabric by impregnation with the gasket-forming material, it is advantageous from the viewpoint of cost reduction or environmental consideration to use divided pieces of electro-conductive non-woven fabric or woven fabric, which can be restored to the desired shape after the impregnation, because the amount of expensive electroconductive non-woven fabric or woven fabric can be suppressed to a minimum.

Use of carbon fibers or fibers of the same kind metal as that of a box member of a product to which the gasket is to be fitted, for the electroconductive non-woven fabric or woven fabric, can avoid electrolytic corrosion due to long-term contact between different kinds of metals or contact through deposited water in a highly humid atmosphere, which is a serious problem when fibers of a different kind of metal from that of a box member of a product to which the gasket is to be fitted, for the electroconductive non-woven fabric or woven fabric.

When the gasket is in an annular shape, where the annular gasket is integrated at the inner peripheral edge with the outer peripheral edge of an annular body of electroconductive non-woven fabric or woven fabric, it is possible to provide strip-shaped partitioning members of electroconductive non-woven fabric or woven fabric, which can partition the inside space of the annular body into part units or block units, in a form as integrated with or connected to an annular body of the electroconductive non-woven fabric or woven fabric, thereby providing an electromagnetic wave shielding in the form of part units or block units.

The present electromagnetic wave shielding gasket based on electroconductive non-woven fabric or woven fabric is based on impregnation of a portion of non-woven fabric or woven fabric with a rubber portion having a gasket function for the integration, thereby overcoming such processwise serious problems as less available means for effective bonding of the rubber layer as encountered in the case of using aluminum materials as metallic materials in the formation of metal-rubber laminates disclosed, for example, in Patent Literature 4.

Patent Literature 4: JP-A-2003-232444

In the metal-rubber laminates, a surface pressure for sealing can be provided by the spring effect of substrate materials, but such a spring effect cannot be expected from aluminum materials or carbon materials due to characteristics inherent therein. In the metal-rubber laminates, seal reliability can be increased by providing beads, but these materials without any expectable spring effect would not improve the sealability effectively, even if the beads were formed thereon. In the present electromagnetic wave shielding gasket based on the electroconductive non-woven fabric or woven fabric, on the other hand, the seal part of the gasket body can perform the main role of seal function, whereas the electroconductive non-woven fabric or woven fabric adjacent to the seal part is provided to be only compressed. Thus, such a spring effect problem can be overcome in the present invention.

The present electromagnetic wave shielding gasket can be effectively used as gaskets necessary for shielding and sealing electronic equipment in severe circumstances existing water, oil, dusts, etc., such as inner parts of automobile engine rooms, construction machinery, factories, etc. or weather-beaten outdoor electronic equipment.

BRIEF DESCRIPTION OF DRAWINGS

FIG. 1 a plan view showing a particularly preferable mode of the present electromagnetic wave shielding gasket.

FIG. 2 a cross-sectional view along the line A-A at the time of molding.

FIG. 3 a cross-sectional view of a gasket product fitted to a box member and a lid member.

FIG. 4 a graph showing relations between degree of compression and repulsive force of gasket body and electroconductive non-woven fabric or woven fabric when used under compression.

FIG. 5 a cross-sectional view of one mode of the present electro-magnetic wave shielding gasket of flat type.

FIG. 6 a cross-sectional view of another mode of the present electro-magnetic wave shielding gasket of flat type.

FIG. 7 a cross-sectional view of the present electromagnetic wave shielding gasket of roughly circular cross-section type.

FIG. 8 a cross-sectional view of the present electromagnetic wave shielding gasket of roughly triangular cross-section type.

FIG. 9 views showing fabrication steps of an electromagnetic wave shielding gasket using partially divided pieces of electroconductive non-woven fabric or woven fabric, which are assembled into a desired shape after impregnation.

DESCRIPTION OF REFERENCE NUMERALS

1 Electromagnetic wave shielding gasket
2 Gasket body
3, 3' Seal lip parts
4 Inner peripheral edge of gasket body
5 Annular body of electroconductive woven fabric or non-woven fabric
6 Outer peripheral edge of the electroconductive annular body
7 Impregnated part
8 Box member
9 Lid member
10 Nozzle
11 Electroconductive non-woven fabric or woven fabric
12, 12' Linear strip-shaped partitioning members of non-woven fabric or fabric woven
13 Tape of electroconductive non-woven fabric or woven fabric
14 Imaginary gasket shape

BEST MODES FOR CARRYING OUT THE INVENTION

The gasket body may take any shape such as flat, circular cross-section, etc., and an annular gasket body used as a particularly preferable mode may take any shape, so far as it is in an annular shape such as circular, oval, square, rectangular, etc. It is preferable that the gasket body has a lip-shaped seal projection at the front side or the back side, usually at both sides, from the viewpoint of lowering the repulsive force. Formation of the lip-shaped seal projection is effective for tight contact between the box member and the lid member made of soft material series such as aluminum, resin, etc.

FIGS. 1 and 2 are a plan view and a cross-sectional view along the line A-A thereof at the time of molding, respectively, showing a particularly preferable mode of the present electromagnetic wave shielding gasket 1, where a square-shaped annular body 2 has lip-shaped seal projections 3 and 3' at the front side and the back side, respectively, and is integrated at the inner peripheral edge 4 with the outer peripheral edge 6 of an annular body 5 of the electroconductive non-woven fabric or woven fabric through the impregnated part 7 thereof. Formation of annular gasket body 2 and impregnated part 7 of annular body can be carried out by injecting a gasket-forming material through a gate 10 at the time of molding. As shown in the cross-sectional view of FIG. 8, a sufficient squeeze part of annular body 5 can be given by making the cross-sectional shape of lip-shaped projections 3 and 3' to roughly triangular and also making the thickness of impregnated part 7 smaller than that of the annular body 5 ofelectroconductive non-woven fabric or woven fabric, thereby ensuring the reliability of electromagnetic wave shielding performance thoroughly.

Such integration can be carried out by inserting electroconductive non-woven fabric or woven fabric of carbon fibers, brass fibers, stainless steel fibers, aluminum fibers, etc. at first into molds so as to form an annular body, providing predetermined clearances between the molds, because the non-woven fabric or woven fabric particularly of carbon fibers is very liable to break, compressing the non-woven fabric or woven fabric to a predetermined degree of compressibility, then inserting the outer peripheral edge part of the sandwiched electroconductive annular body in the molds into a shaping mold cavity, injecting rubber into the cavity, thereby molding a gasket body and impregnating the outer peripheral edge part of the electroconductive annular body with the rubber at the same time, and vulcanizing the rubber usually at about 130° to about 180° C. for about 2 to about 10 minutes, though dependent on the kind of the rubber used, thereby firmly integrating the inner peripheral edge 4 of the gasket body with the outer peripheral edge 6 of the electroconductive annular body at rubber-impregnating part 7.

For the electroconductive non-woven fabric or woven fabric, carbon fibers or fibers of the same metal as that of the box member of a product, to which the gasket is to be fitted, are preferably used. For example, stainless steel fibers can be used in the case of a stainless steel box member, and aluminum fibers can be used in the case of an aluminum box member. When fibers of different kind of metal from that of the box member of a product, to which the gasket is to be fitted, are used as fibers for the electroconductive non-woven fabric or woven fabric, occurrence of electrolytic corrosion due to long-term contact between different kinds of metals, or due to contact with deposited water from the highly humid atmosphere will be a problem. Such an electrolytic corrosion problem can be prevented by using non-ionizable carbon fibers or fibers of same kind of metal as that of the box member of a product, to which the gasket is to be fitted.

Thickness or width of electroconductive non-woven fabric or woven fabric can have varied dimensions, depending on uses, so as to attain the electromagnetic wave reflection and ensure the shielding function. The gasket body can be formed also from resins, but rubber is usually preferable. Liquid rubber such as liquid silicone rubber, liquid fluororubber, liquid acrylic rubber, liquid EPDM, etc. can be used as preferable rubber for such uses, but thermoplastic elastomers or solid rubber can be also used. Thermoplastic elastomers based on olefinic series and styrenic series, including, for example, polystyrenic thermoplastic elastomer, a blend thereof with partially dynamically crosslinked polyolefinic thermoplastic elastomer, etc. can be used. Impregnation with the liquid rubber can be carried out by compression molding, screen printing, etc.

Patent Literature 5: JP-A-2004-288296

The present electromagnetic wave shielding gasket thus prepared can be used by fitting it into the gasket groove in the box member of electronic equipment so as to be inserted between the box member and the lid member. When the gasket product is used under compression, as shown in FIG. 3, it is important that the electroconductive non-woven fabric or woven fabric is compressed by box member 8 and lid member 9 and is brought into tight contact with the box member and the lid member.

The gasket is provided to seal the inside and outside of a box member, but in the case of using it as an electromagnetic wave shield, individual parts contained in the box member must be sometimes shielded separately, that is, any influence of an electromagnetic wave on the individual parts must be prevented. In such a case, a linear strip-shaped partitioning member 12 of non-woven fabric or woven fabric connected to the facing sides of the annular body 5 of electroconductive non-woven fabric or woven fabric, a strip-shaped partitioning member 12' connecting the strip-shaped partitioning member 12 to one side of the annular body 5, etc. can be provided, as shown in FIG. 1, so that the annular body may not have a free inside space, but can be partitioned into part units or block units.

Such partitioning members 12 and 12' can be provided together with the annular body at the same time by cutting them from a sheet of electroconductive non-woven fabric or woven fabric, or by bonding separate strips of non-woven fabric or woven fabric to the annular body 5. The bonding can be carried out by impregnating the bonding part with rubber, resin, etc. or by making the annular body 5 partially overlap with the strips of the non-woven fabric or woven fabric, followed by bonding the annular body to the strips with an adhesive. To ensure the electro-magnetic wave shieldability of the bonded parts, it is preferable to use electroconductive rubber, resin or adhesive, and when an excessive repulsive force is generated at the bonded parts, it is preferable to carry out bonding by impregnation with liquid rubber of low hardness. Such bonding can be also carried out at the same time as the impregnation with rubber when the gasket is molded, or the bonding can be also carried out with rubber, resin, or an adhesive before the gasket is to be molded or after it has been molded.

As given in the graph of FIG. 4, showing relations between degree of compression and repulsive force of gasket body and electro-conductive non-woven fabric or woven fabric when the gasket product is compressed, it is important to design the gasket product so that the electroconductive non-woven fabric or woven fabric can show some repulsive force within the practical compression range of the gasket body, where the repulsive force of electroconductive non-woven fabric or woven fabric is so low, as compared with the repulsive force of the gasket body, as to give no trouble in fastening a lid member to a box member. Clearances between the box member and the lid member are filled with the electro-conductive non-woven fabric or woven fabric, whereby leakage of electro-magnetic wave to the outside can be prevented.

When a gasket comprising electroconductive non-woven fabric or woven fabric is used by sandwiching it between a lid member and a box member, the compressibility is set to about 5 to about 20% in the case of brittle carbon fibers and to about 5 to about 50% in the case of other metallic fibers. When the compressibility is less than the lower limit value, the contact state of electroconductive non-woven fabric or woven fabric with the lid member and the box member will be sometimes insufficient, giving rise to contact failure in the course of working. When the compressibility is higher than the upper limit values, the carbon fibers are very likely to break, and even the metallic fibers also have a problem of high repulsive force generated by the tight sealing. Upper limit values of the compressibility naturally depend on the fiber density of the non-woven fabric or woven fabric, and thus are not limited to the above-mentioned upper limit values.

When the compressibility of the gasket is too low, the sealability will be insufficient, whereas too high a compressibility results in generation of a higher repulsive force. Thus, the compressibility must be appropriately selected in view of gasket shapes and hardness of materials, and usually it is in a range of about 5 to about 50%. For example, the compressibility of gasket materials having a hardness of 40 to 50 is set to about 10% in the case of flat gaskets, whereas in the case of gaskets having a lip-shaped projection the compressibility is set to about 40% of lip-shaped projection volume. In the case of lower hardness, the compressibility is set to a higher value, whereas in the case of higher hardness the compressibility is set to a lower value.

While particularly preferable modes of the present electromagnetic wave shielding gasket have been described in detail, referring to FIGS. 1 to 3, other modes are naturally also possible, so long as the electromagnetic wave shielding gasket is in an integrated structure comprising a gasket body and an electroconductive non-woven fabric or woven fabric, where a seal part is formed, while avoiding the area of electroconductive non-woven fabric or woven fabric including the impregnated part thereof.

For example, FIG. 5 is a cross-sectional view of a flat type gasket, where reference numeral 2 shows a gasket body, 7 an impregnated part and 11 a non-woven fabric.

In FIG. 5, the gasket body 2 and the non-woven fabric 11 are set to equal thickness, but in FIG. 6 the gasket body 2 is set to a smaller thickness than that of the non-woven fabric 11. This type of the gasket has such an advantage that the electroconductive non-woven fabric or woven fabric can be brought into tight contact with the box member and the lid member in the case of a flat type gasket incapable of setting the gasket compressibility to a higher value, due to the structurally restricted repulsive force. When the compressibility of the impregnated part 7 becomes higher than that of the gasket body 7 and when the impregnated part 7 is so compressed as to attain the required sealability, the repulsive force of the impregnated part will be a problem. In such a case, it is preferable to make the impregnated part 7 shorter to such a length as not to cause any bonding trouble or to use a gasket-forming material of lower hardness.

FIG. 7 is a cross-sectional view of a gasket of a type of roughly circular cross-section, where the impregnated part 7 of non-woven fabric 11 has a roughly circular cross-section together with gasket body 2. When the electroconductive non-woven fabric or woven fabric is compressed to such a degree as to attain tight contact with the lid member and the box member in the case of such a type of the gasket, such a problem will be encountered that the compressibility of the gasket body will be higher. In such a case, it is necessary to use a gasket-forming material of very low hardness.

In the fabrication of an electromagnetic wave shielding gasket, a sheet of the electroconductive non-woven fabric or woven fabric, particularly for use in the fabrication of an annular gasket must be blanked to punch out the center part to obtain the necessary annular body, and the punched-out center part may be reused for fabrication of another gasket of smaller dimension or thrown out, if it is inevitable to do so, in spite of expensive carbon fiber or metallic fiber non-woven fabric or woven fabric.

To avoid such a situation, it is preferable to use partially divided pieces of electroconductive non-woven fabric or woven fabric, which are to be assembled into the desired shape after the impregnation, in the integration of the electroconductive non-woven fabric or woven fabric with the gasket body by impregnation of the former with a gasket-forming material. Shapes of the partially divided pieces include, for example, a tape-shaped material cut into long strip with a nearly the same width as that of the gasket, etc. Long strip tape-shaped materials in a linear form or gentle curve form can be used. Dividing positions into pieces (contact positions of edges of long strip tape-shaped material) of the annular body 5 of electroconductive non-woven fabric or woven fabric are not particularly limited, but are preferably bolting positions (not specifically shown in the drawing) for fixing the lid member 9 to the box member 8.

FIG. 9 shows one mode of gasket fabrication according to the afore-mentioned fabrication method. For example, in fabrication of a gasket, having 199 mm×299 mm in outer sizes and 5 mm in width, for a box member with a flange rim, having 200 mm×300 mm in outer sizes and about 5 mm in rim width, two pairs of carbon fiber tapes, having 3 mm wide for each and 192 mm long for one pair and 292 mm for another pair are used (a), and these four carbon fiber tapes 13 are brought into contact with one another each at the longitudinal edge parts to form a desired gasket shape 14, and arranged into an annular body, 195 mm×295 mm in outer sizes (b). Then, a gasket body is molded, while impregnating parts of carbon fibers at the outer peripheral sides of the annular body with a gasket-forming material to form an electromagnetic wave shielding gasket of a shape, as shown, for example, in the cross-sectional view of FIG. 8. Plan view of such an electromagnetic wave shielding gasket comprising a gasket body 2 with lip-shaped projections, an impregnated part 7 and an annular body 5 of electroconductive non-woven fabric or woven fabric is shown in FIG. 9(c). The contact parts each of the longitudinal edge parts of carbon fiber tapes can be integrated together by impregnation of gasket-forming material and formation of lip-shaped projections without any formation of clearances between the longitudinal edge parts, while attaining complete electrical connection therebetween.

The invention claimed is:

1. An electromagnetic wave shielding gasket, which comprises a gasket body made of rubber and an electroconductive non-woven fabric or woven fabric, the gasket body and the electroconductive non-woven fabric or woven fabric being integrated together at an edge of the gasket body by impregnating the non-woven fabric or woven fabric with a gasket-forming material, and a seal part being formed while avoiding the area of the electroconductive non-woven fabric or woven fabric including the impregnated part.

2. An electromagnetic wave shielding gasket according to claim 1, wherein the electro conductive non-woven fabric or woven fabric is a fabric assembled from partially divided pieces into a desired shape after the impregnation.

3. An electromagnetic wave shielding gasket according to claim 1 for use in conjunction with a metal box member or metal produce, wherein the electroconductive non-woven fabric or woven fabric is made of carbon fibers or a similar metal as that of a the box member or a product, to which a gasket is to be fitted.

4. An electromagnetic wave shielding gasket according to claim 1, wherein the gasket body has a lip-shaped projection.

5. An electromagnetic wave shielding gasket according to claim 1, wherein the gasket body has an annular shape and is integrated at an inner peripheral edge with an outer peripheral edge of an annular body of the electroconductive non-woven fabric or woven fabric.

6. An electromagnetic wave shielding gasket according to claim 5, in combination with a box member and a lid member of an electronic device wherein the electromagnetic wave shielding gasket is inserted between the box member and the lid member.

7. An electromagnetic wave shielding gasket according to claim 6, where the electroconductive non-woven fabric or woven fabric is compressed by the box member and the lid member and brought into contact with the box member and the lid member.

8. An electromagnetic wave shielding gasket according to claim 1, in combination with a box member and a lid member of an electronic device wherein the electromagnetic wave shielding gasket is inserted between the box member and the lid member.

9. An electromagnetic wave shielding gasket according to claim 8, where the electroconductive non-woven fabric or woven fabric is compressed by the box member and the lid member and brought into contact with the box member and the lid member.

10. An electromagnetic wave shielding gasket according to claim 1, wherein the gasket is an annular body, the annular gasket body is integrated at an inner peripheral edge with an outer peripheral edge of an annular body of the electroconductive non-woven fabric or woven fabric, and strip-shaped partitioning members of electroconductive non-woven fabric or woven fabric, which partition the inside space within the annular body into part units or block units, are provided as integrated with or bonded to the annular body of the electroconductive non-woven fabric or woven fabric.

\* \* \* \* \*